United States Patent
Makino

(10) Patent No.: US 7,590,027 B2
(45) Date of Patent: Sep. 15, 2009

(54) NONVOLATILE SEMICONDUCTOR MEMORY DEVICE

(75) Inventor: Eiichi Makino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 180 days.

(21) Appl. No.: 11/867,443

(22) Filed: Oct. 4, 2007

(65) Prior Publication Data

US 2008/0259685 A1 Oct. 23, 2008

(30) Foreign Application Priority Data

Oct. 4, 2006 (JP) ............................. 2006-273303

(51) Int. Cl.
*G11C 7/10* (2006.01)

(52) U.S. Cl. ............................. 365/238.5; 365/185.03; 365/189.04; 365/189.12; 365/233

(58) Field of Classification Search ............. 365/238.5, 365/233, 189.04, 189.12, 185.03, 205
See application file for complete search history.

(56) References Cited

U.S. PATENT DOCUMENTS

| | | | | |
|---|---|---|---|---|
| 6,118,696 | A * | 9/2000 | Choi ..................... | 365/185.11 |
| 6,288,936 | B1 * | 9/2001 | Kawamura ............. | 365/185.03 |
| 6,798,697 | B2 | 9/2004 | Hosono et al. | |
| 6,842,377 | B2 | 1/2005 | Takano et al. | |
| 6,845,041 | B2 | 1/2005 | Lee | |
| 6,957,378 | B2 | 10/2005 | Koga et al. | |
| 7,102,928 | B2 * | 9/2006 | Kawamura ............. | 365/185.17 |

FOREIGN PATENT DOCUMENTS

JP 2003-233992 8/2003

* cited by examiner

*Primary Examiner*—Son Dinh
(74) *Attorney, Agent, or Firm*—Oblon, Spivak, McClelland, Maier & Neustadt, L.L.P.

(57) ABSTRACT

A nonvolatile semiconductor device includes a plurality of word lines, a plurality of bit lines, a plurality of memory cell arrays having a plurality of electrically reprogrammable memory cells which are connected to said word lines and said bit lines, a data program control section which programs a plurality of first multi-bits data each having a first number of bits, or a plurality of second multi-bits data each having a second number of bits twice that of said first multi-bits data, to said plurality of memory cell arrays, a page buffer circuit which stores said plurality of first multi-bits data or said plurality of second multi-bits data which is read for each of said word lines from said plurality of memory cell arrays, a data transfer section which transfers said plurality of first multi-bits data or said plurality of second multi-bits data which is read for each of said second number of bits from said page buffer circuit synchronized with a second clock signal having a cycle which is twice that of a first clock signal, and a data output section which receives said data from said data transfer section and outputs externally said data in synchronization with said first clock signal.

20 Claims, 5 Drawing Sheets

NONVOLATILE SEMICONDUCTOR MEMORY DEVICE

CROSS REFERENCE TO RELATED APPLICATIONS

This application is based upon and claims the benefit of priority from the prior Japanese Patent Application No. 2006-273303, filed on Oct. 4, 2006; the entire contents of which are incorporated herein by reference.

BACKGROUND OF THE INVENTION

1. Field of the Invention

The present invention relates to a nonvolatile semiconductor device arranged with a memory cell array having a plurality of memory cells which can electrically reprogram data.

2. Description of the Related Art

As described in Japanese Laid Open Patent 2003-233992, a device which can electrically reprogram a plurality of data which is stored in a memory cell array as a nonvolatile semiconductor memory device, is proposed. In this type of nonvolatile semiconductor memory device, a plurality of data which is read from a memory cell array is once transferred to an I/O buffer after having been once stored in a page buffer circuit.

Here, in this type of nonvolatile semiconductor memory device, for example, there is a nonvolatile semiconductor memory device which is arranged with both a function which transfers eight bits as a single unit of data (eight bit data) to an I/O buffer device (eight bit data transfer function) after reading the data from a memory cell array and transferring the data to a page buffer circuit, and a function which transfers sixteen bits as a single unit of data (sixteen bit data) to an I/O buffer device (sixteen bit data transfer function) after reading the data from a memory cell array and transferring the data to a page buffer circuit. While a usual construction of an I/O is eight I/O, one part has a sixteen I/O construction, therefore, there is a nonvolatile semiconductor memory device having both the functions so that it can be managed within the same chip regardless of I/O construction.

In a nonvolatile semiconductor memory device which is arranged with both an eight bit data transfer function and a sixteen bit data transfer function, data is transferred with the operation of a sixteen bit data transfer function as a standard. Therefore, in this type of nonvolatile semiconductor memory device, sixteen bits of data is transferred in one transfer cycle period in the case where this data is sixteen bit data. However, in the case where this data is eight bit data, two eight bits of data can not be transferred in one transfer cycle period, only one eight bit data can be transferred. Consequently, there is a problem whereby data can not be transferred at high speed.

BRIEF SUMMARY OF THE INVENTION

A nonvolatile semiconductor memory device related to one embodiment of the present invention comprises a plurality of word lines, a plurality of bit lines, a plurality of memory cell arrays having a plurality of electrically reprogrammable memory cells which are connected to said word lines and said bit lines, a data program control section which programs a plurality of first multi-bits data each having a first number of bits, or a plurality of second multi-bits data each having a second number of bits twice that of said first multi-bits data, to said plurality of memory cell arrays, a page buffer circuit which stores said plurality of first multi-bits data or said plurality of second multi-bits data which is read for each of said word lines from said plurality of memory cell arrays, a data transfer section which transfers said plurality of first multi-bits data or said plurality of second multi-bits data which is read for each of said second number of bits from said page buffer circuit synchronized with a second clock signal having a cycle which is twice that of a first clock signal, and a data output section which receives said data from said data transfer section and outputs externally said data in synchronization with said first clock signal.

A nonvolatile semiconductor memory device related to one embodiment of the present invention comprises a plurality of word lines, a plurality of bit lines, a plurality of memory cell arrays having a plurality of electrically reprogrammable memory cells which are connected to said word lines and said bit lines, a data program control section which programs a plurality of first multi-bits data each having a first number of bits, or a plurality of second multi-bits data each having a second number of bits twice that of said first multi-bits data, to said plurality of memory cell arrays, a page buffer circuit which stores said plurality of first multi-bits data or said plurality of second multi-bits data which is read for each of said word lines from said plurality of memory cell arrays, a sense amplifier section which stores said plurality of first multi-bits data or said plurality of second multi-bits data which is read for each of said second number of bits from said page buffer circuit synchronized with a second clock signal having a cycle which is twice that of a first clock signal, a data transfer control circuit which transfers said data which is stored in said sense amplifier section which is read for each of said second number of bits synchronized with a second clock signal, and a data output section which receives said data from said data transfer control circuit and outputs externally said data in synchronization with said first clock signal.

A method of a data transfer method one embodiment of the present invention comprises reading a plurality of first multi-bits data each having a first number of bits or reading a plurality of second multi-bits data each having a second number of bits twice that of said first multi-bits data, for each of said second number of bits from a page buffer circuit synchronized with a first clock signal which is synchronized with a second clock signal having a cycle twice that of said first clock signal, said data being read for each word line from a plurality of memory cell arrays and stored in said page buffer circuit, transferring said data which is read from said page buffer circuit to a plurality of registers arranged in said second number of bits and storing said data in said plurality of registers, and transferring said data which is stored in said plurality of registers externally from said plurality of registers synchronized with said first clock signal for each volume of data of said first number of bits.

DETAILED DESCRIPTION OF THE INVENTION

The embodiments of the present invention will be explained in detail below while referring to the attached drawings. Further, the present invention is not limited to these embodiments.

Embodiment One

Generally, in an I/O construction of a nonvolatile semiconductor device such as an external I/O pad, for example, eight I/O product with eight input/output terminals (I/O terminal) are the main, however depending on the needs of the user a sixteen I/O product is also mixed. Therefore, the nonvolatile semiconductor memory device is designed so that it can accommodate either an eight I/O product or a sixteen I/O product within the same chip. Specifically, sixteen series of data transfer pass are arranged within the nonvolatile semiconductor memory device and internal operations are controlled. At the time of reading data corresponding to a sixteen I/O product, sixteen bits (two bytes) of data from the data which is stored in a reading and reprogramming circuit (herein called a page buffer circuit) are transferred to an I/O terminal in order synchronously with an external clock. At this time, among the sixteen series of data transfer pass, eight series of data pass are made an inactive state. The same is the case for the transfer of program data. In this way, the control of data transfer, because there is almost no change in the case of a sixteen I/O product or an eight I/O product, it is difficult to increase the data transfer speed even in the case of an eight I/O product. Page buffer size has increased year by year from 512 bytes to 2 kb and even 4 kb, and in proportion to this data load times have been extended making an increase in data transfer speed an absolute imperative. In the nonvolatile semiconductor device of this invention it is possible to increase data transfer speed in the case of an eight I/O product by controlling an internal control which operates artificially so that the transfer of data in the case an eight I/O product is the same as the transfer of data in the case a sixteen I/O product.

[Construction of a Nonvolatile Semiconductor Memory Device]

Figure 1:
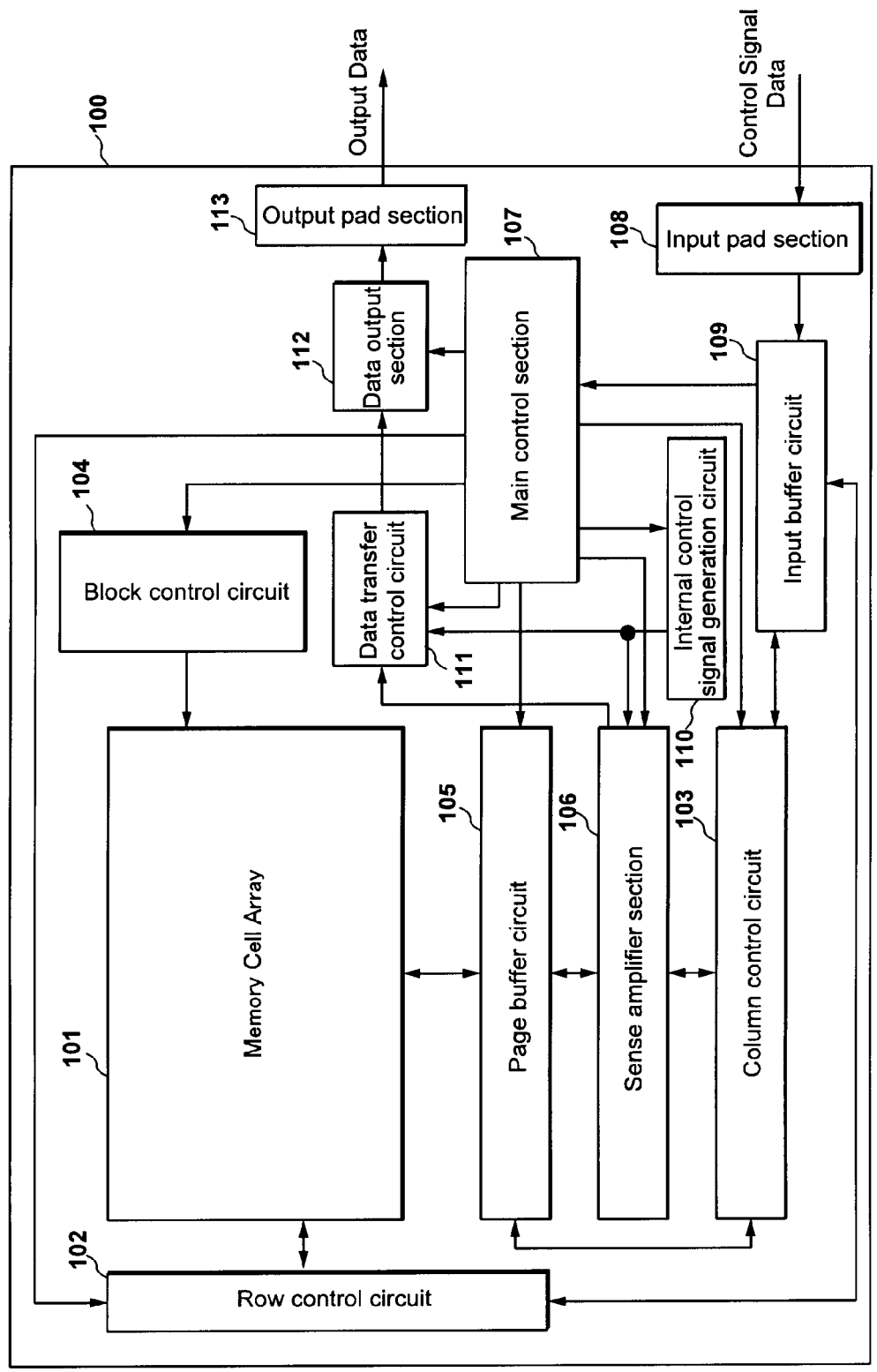
FIG. 1 is a block diagram which shows a construction of one NAND type flash memory device of the nonvolatile semiconductor memory device related to embodiment one of this invention.

First, embodiment one of this invention will be explained in detail while referring to the drawings. FIG. 1 is a block diagram which shows a construction of one NAND type flash memory device of the nonvolatile semiconductor memory device related to embodiment one of this invention.

As is shown in FIG. 1 the NAND type flash memory device 100 of the nonvolatile semiconductor memory device related to embodiment one of this invention includes a memory cell array 101, a row control circuit 102, a column control circuit 103, a block control circuit 104, a page buffer circuit 105, a sense amplifier section 106, a main control section 107, an input pad section 108, an input buffer circuit 109, an internal control signal generation circuit 110, a data transfer control circuit 111, a data output section 112 and an output pad section 113.

The memory cell array 101 has a plurality of word lines, a plurality of bit lines and a plurality of electrically reprogrammable memory cells. The input buffer circuit 109 receives data and control signals (for example, commands and clock signals) from an external device and temporarily stores these data and control signals within the input buffer circuit device 109. Then, the input buffer circuit 109 transfers these control signals to the main control section 107 and transfers the data to the row control circuit 102 and the column control circuit 103.

The main control section 107 controls the row control circuit 102, the column control circuit 103, the block control circuit 104, the page buffer circuit 105, the sense amplifier section 106 and the data transfer control circuit 111 based on the control signals transferred from the input buffer device 109. The main control section 107 generates a first clock signal (herein called an external control signal) (RE1x) which has the same cycle of a clock signal (/RE) transferred from an external device via the input buffer circuit 109, transferred from an external device via the input buffer device 109 and transfers them to the internal control signal generation circuit 110 and the data output section 112. The internal control signal generation circuit 110 receives an external control signal (RE1x) from the main control section 107, generates a second clock signal (herein called an internal control signal) (RE2x) which has cycle twice that of the external control signal and transfers it to the sense amplifier section 106 and the data transfer control circuit 111.

The main control section 107 transfers data erasure information to the row control circuit 102, the column control circuit 103 and the block control circuit 104 and each circuit which received this data erasure information performs erasure of the data which was stored in memory cells within the memory cell array 101. Also, the main control circuit 107 transfers the access information to the memory cells within the memory cell array 101, to the row control circuit 102, the column control circuit 103, the block control circuit 104 and the page buffer circuit 105. The row control circuit 102, the column control circuit 103, the block control circuit 104 and the page buffer circuit 105 programs data to the memory cells within the memory cell array 101 based on data and the access information and the data which are transferred from the main control section 107.

In the NAND type flash memory device 100 relating to embodiment one of this invention, the internal data transfer pass arranges a number of the second number of bits so that whichever data of the first multi-bits data which has a first number of bits and the second multi-bits data which has second number of bits twice that of the first multi-bits data can be accommodated. Therefore, the row control circuit 102, the column control circuit 103, the block control circuit 104 and the page buffer circuit 105 can program a plurality of first multi-bits data which has a predetermined first number of bits or a plurality of second multi-bits data which has second number of bits twice the number of the first multi-bits data when programming of data to a memory cells within the memory cell array 101. That is, the main control circuit 107, the row control circuit 102, the column control circuit 103, the block control circuit 104 and the page buffer circuit 105 are constructed of a data program control section which programs a plurality of first multi-bits data which has a predetermined first number of bits or a plurality of second multi-bits data which has second number of bits twice the number of the first multi-bits data to the memory cells within the memory cell array 101.

In addition, the row control circuit 102, the column control circuit 103 and the block control circuit 104 controls the page buffer circuit 105 and the sense amplifier section 106 and performs reading of the data in memory cells within the memory cell array 101. The main control section 107 controls the data transfer control circuit 111. Also, the data transfer control circuit 111 transfers the data which is temporarily stored in the sense amplifier 106 to the data output section 112 from the sense amplifier section 106.

The page buffer circuit 105 reads the plurality of the first multi-bits data or the plurality of the second multi-bits data for each word line from the memory cell array 101 and it is temporarily stored in the page buffer circuit 105. Here, the page buffer circuit 105 of a number of the first number of bits is connected to one column select line (herein written as CSL). Therefore, in the case where data which corresponds to the I/O product of the first number of bits is read, the data of the first number of bits is read from the page buffer circuit 105 by the activation of one CSL. In the case where data which corresponds to the I/O product of the second number of bits is read, the data of the second number of bits is read at the same time from the page buffer circuit 105 by the activation of two CSL's.

The activation of the CSL is performed by an address counter control and in the case where data which corresponds to the I/O product of the second number of bits, is read, for example, two CSL's are activated by ignoring an A0 internal address. However, this is one example and is not limited to this. In addition, in the case where data which corresponds to the I/O product of the first number of bits, is read, the first multi-bits data n (n is an even number) which corresponds to a read address and the first multi-bits data n+1 which corresponds to an address one above this address are read at the same time and transferred by an address counter control. Therefore, the amount of data which is transferred becomes an amount of data of the second multi-bits data which is twice that of the first multi-bits data. As stated above, because the data transfer pass is arranged with a number of second number of bits, there is no need to again increase the number of data transfer passes.

The sense amplifier section 106 reads the first multi-bits data or the second multi-bits data from the page buffer circuit 105 for each second number of bits synchronized with the internal control signal (RE2x) which has a cycle twice that of the external control signal (RE1x), and temporarily stores it as storage data in the sense amplifier section 106. That is, the sense amplifier 106 includes a latch function.

Figure 2:
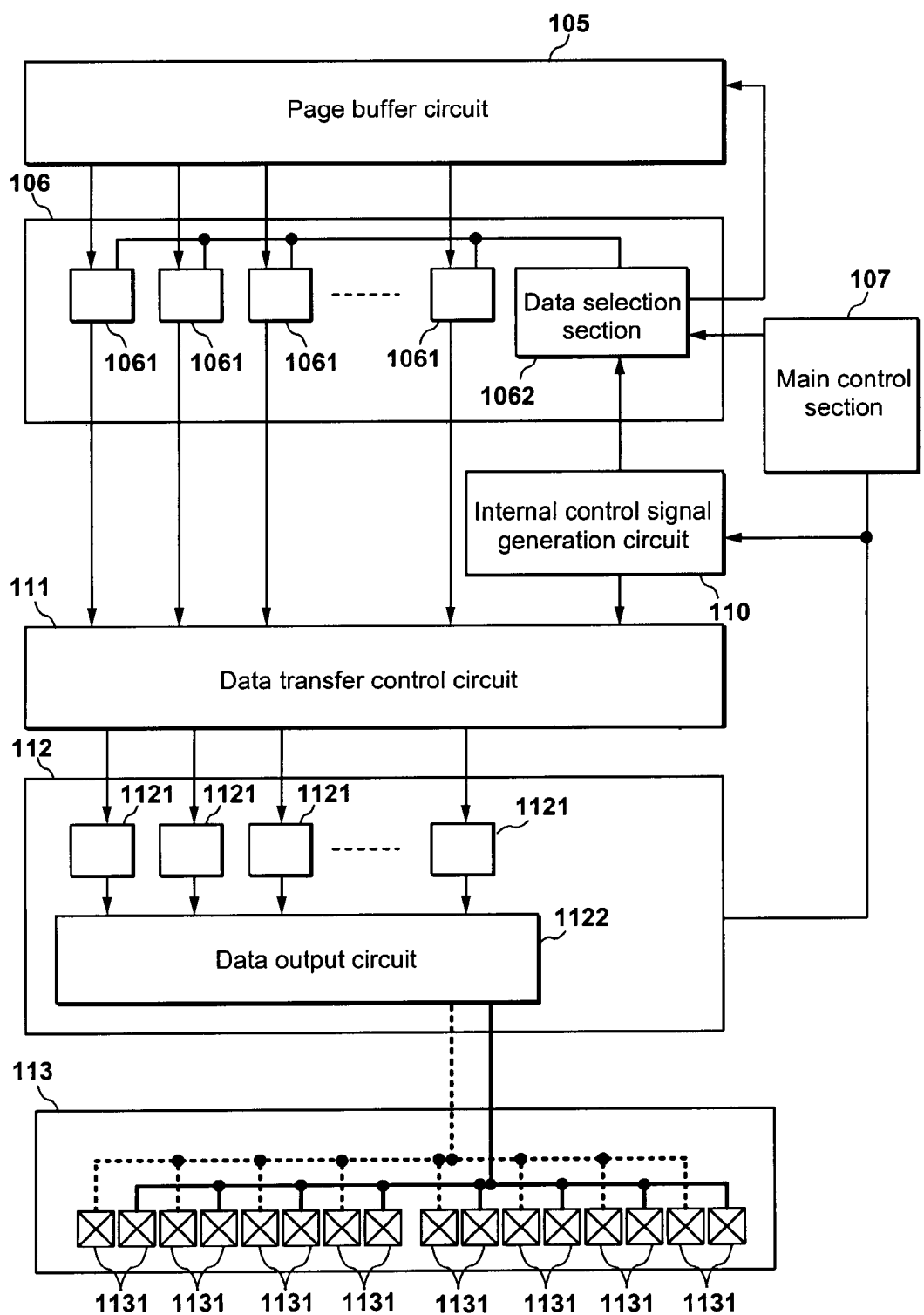
FIG. 2 a block diagram which shows a construction of the required parts of one NAND type flash memory device of the nonvolatile semiconductor memory device related to embodiment one of this invention.

As is shown in FIG. 2, the sense amplifier 106 includes sense amplifiers 1061 of the same number as the second number of bits and one data selection section 1062. The plurality of sense amplifiers 1061 are each arranged between a page buffer circuit 105 and a data transfer control circuit 111 and connected to them. The data selection section 1062 is connected to the page buffer circuit 105, the plurality of sense amplifiers 1061, the main control circuit 107 and the internal control signal generation circuit 110.

The data selection section 1062 operates based on a control signal from the main control section 107 and the first multi-bits data or the second multi-bits data is read sequentially from the page buffer circuit 105 by the plurality of sense amplifiers 1061 and stored in the plurality of sense amplifiers 1061. The data selection section 1062 controls the plurality of sense amplifiers 1061 so that data is read from the page buffer circuit 105 for each data amount of the second number of bits synchronized with the internal control signal (RE2x) which was received from the internal control signal generation circuit 110.

As is shown in FIG. 2, the data transfer control circuit 111 reads the storage data which is stored in the sense amplifiers 1061 of the sense amplifier section 106 and transfers the data to the data output section 112 synchronized with the internal control signal (RE2x).

The data output section 112 receives and stores the data from the data transfer control circuit 111 and synchronized with the external control signal (RE1x) outputs the data to the output pad section 113. As is shown in FIG. 2, the data output section 112 includes the same number of registers 1121 as the second number of bits and one data output circuit 1122. The plurality of registers 1121 are connected to an output terminal of the data transfer control circuit 111. The data output circuit 1122 is connected between the plurality of registers 1121 and the output pad section 113.

The plurality of registers 1121 receive and store data from the data transfer control circuit 111. The data output circuit 1122 reads the data stored in the plurality of registers 1121 and transfers the data to the output pad section 113 synchronized with the external control signal (RE1x). The output pad section 113 has the same number of output pads 1131 as the second number of bits. The data output circuit 1122 transfers the output data to an external device via the plurality of output pads 1131. Further, as stated above, in the case of reading data which corresponds to an I/O product of a first number of bits, the first multi-bit data n (n is an even number) which corresponds to a read address and the first multi-bit data n+1 which corresponds to an address which is one above this read address are read simultaneously from the page buffer circuit 105 by an address counter control and transferred to and stored in the plurality of registers 1121 via the data transfer control circuit 111. Then, the data is transferred to the output pad section 113 via the data output circuit 1122 from the plurality of registers 1121. At this time, the data output circuit 1122 reads the data stored in the plurality of registers 1121 for each of the first multi-bits data and transfers the data to the data output pad section 113 synchronized with the external control signal (RE1x). That is, the data output circuit 1122 reads and transfers the first multi-bits data n (n is an even number) which corresponds to a read address in a transfer cycle of the external control signal, and reads and transfers the first multi-bits data n+1 which corresponds to a read address one above this read address in the next transfer cycle of the external control signal. Therefore, in the NAND type flash memory related to embodiment one of the present invention, because data is transferred up to just before the data output circuit 1122 from the page buffer circuit 105 using a signal (internal control signal) which has twice the cycles of the external control signal and is transferred up to the output pad section 113 from the plurality of registers 1121 which are added to the data output circuit 1122 using a signal which is synchronized with the external control signal and has the same cycle of the external control signal, it is possible to enlarge a timing margin up to just before the data output circuit 1122 from the page buffer circuit 105 to a maximum of twice. In addition, because data can be output with the same cycle as the external control signal, it is possible to easily increase speed. Therefore, in the NAND type flash memory device 100 relating to embodiment one of this invention, it is possible to increase data transfer speed in the case of reading data corresponding to an I/O product of a first number of bits. And, because this operation is an operation within a chip, it is possible to increase speed without changing existing user usage.

Figure 3:
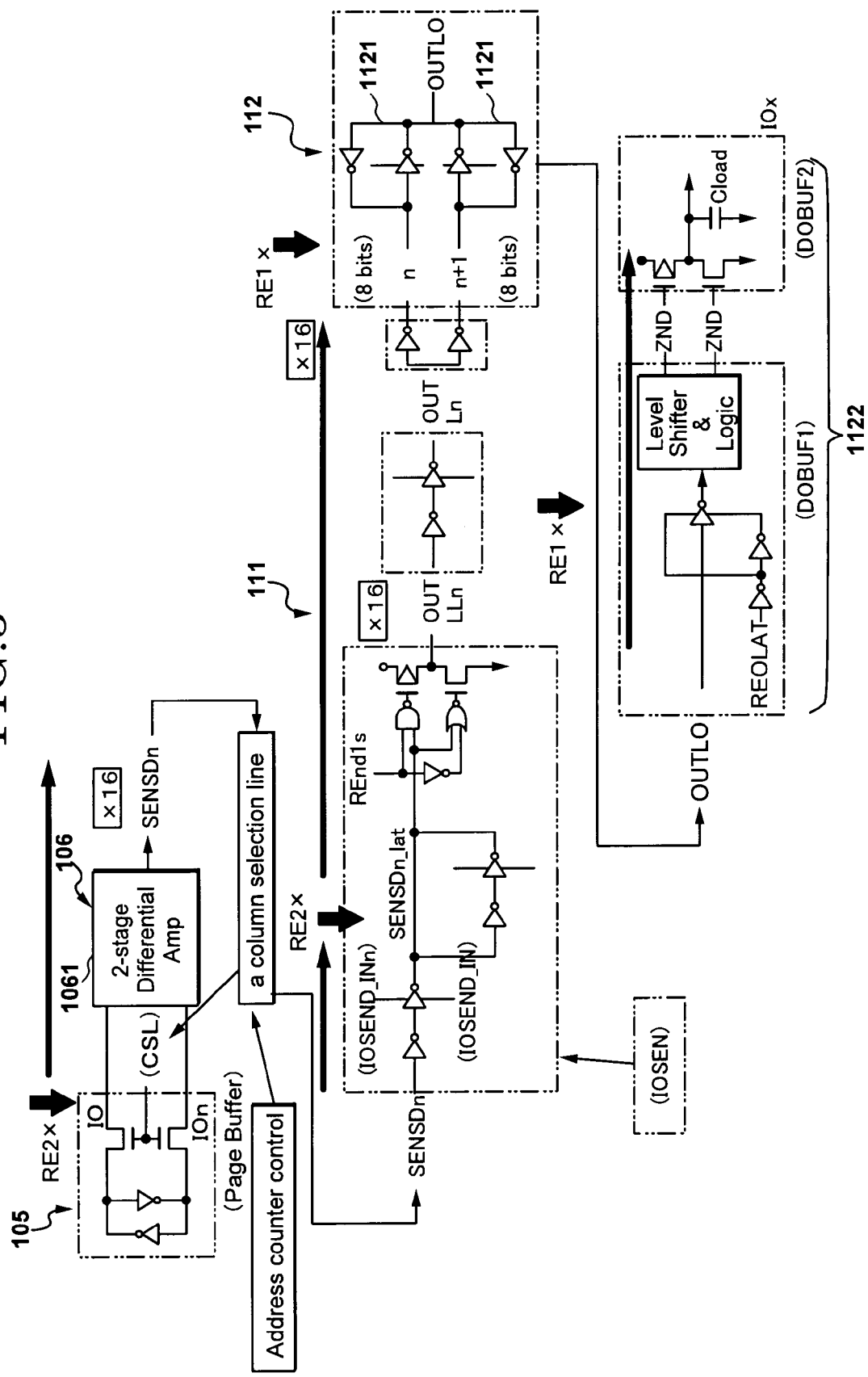
FIG. 3 is a drawing for explaining the operation of a NAND type flash memory device related to embodiment one of this invention.
Figure 4:
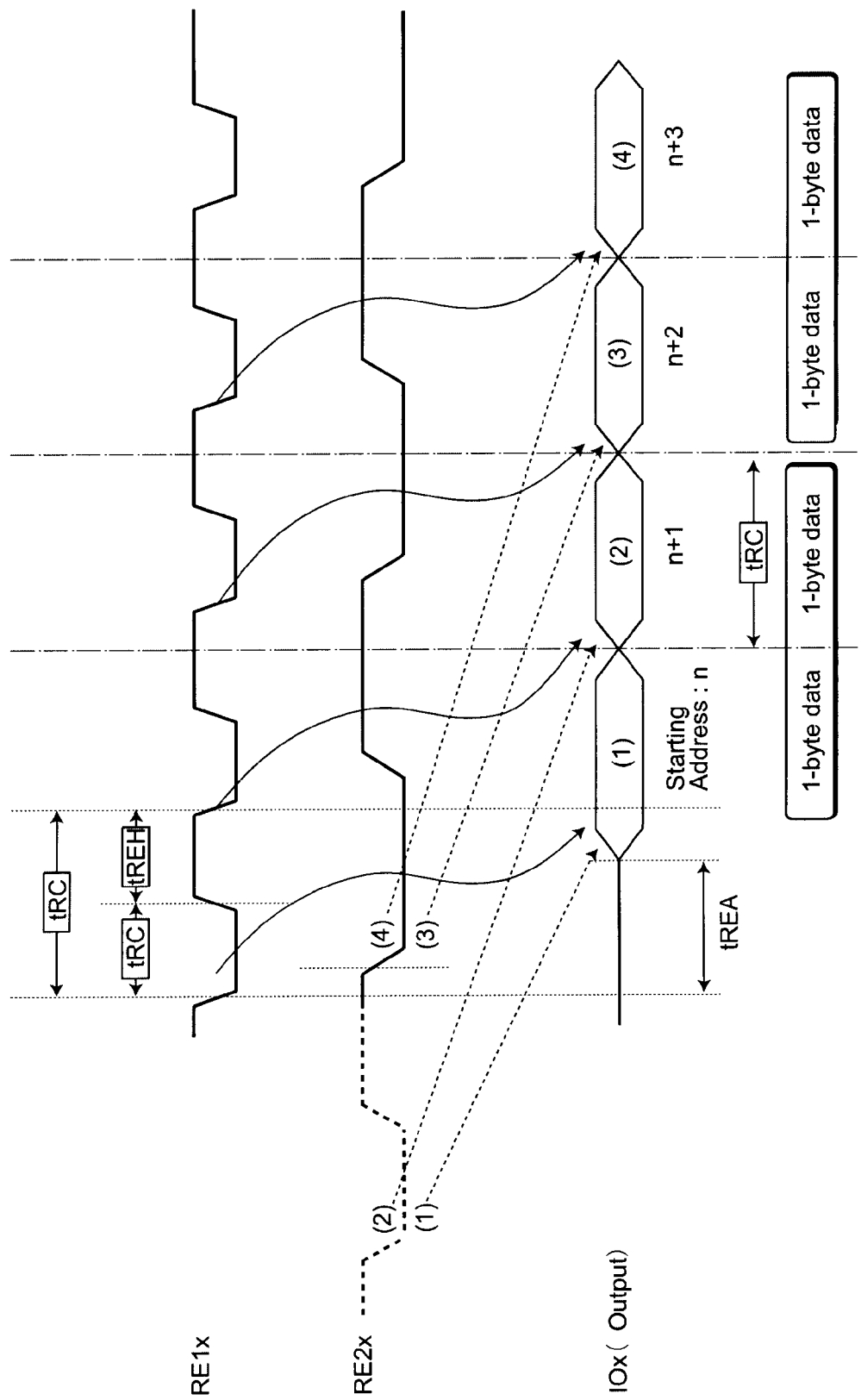
FIG. 4 is a timing chart for explaining the operation of a NAND type flash memory device related to embodiment one of this invention.

Next, the operation of the NAND type flash memory device 100 relating to embodiment one of this invention will be explained while referring to FIG. 3 and FIG. 4. FIG. 3 is a drawing for explaining the operation of the NAND type flash memory device 100. FIG. 4 is a timing chart for explaining the operation of the NAND type flash memory device 100 relating to embodiment one of this invention.

Here, in the NAND type flash memory device 100 relating to embodiment one of this invention, the case where the first multi-bits data is data of eight bits and the second multi-bits data is data of sixteen bits is explained.

In addition, as is shown in FIG. 4, the internal control signal generation circuit 110, receives the external control signal (RE1x) and generates an internal control signal (RE2x) which has twice the cycles of this external control signal (RE1x).

Also, the plurality of first multi-bits data which is data of eight bits and the plurality of second multi-bits data which is data of sixteen bits which is twice that the information amount of the first plurality of multi-bits data is programmed to the memory cell array 101 by the data program control section.

As is shown in FIG. 3, based on a control signal from the main control section 107 and synchronized with the internal control signal RE2x the data selection section 1062 selects and reads the first multi-bits data or the second multi-bits data from the page buffer circuit 105 for each second number of bits and stores the data in the plurality of sense amplifiers 1061 as storage data. At this time, as stated above, in the case where the data programmed is eight bit data (first multi-bits data) eight bit data n (n is an even number) which corresponds to a read address, and eight bits data n+1 which corresponds to an address one above this read address, is read simultaneously from the page buffer circuit 105 by an address counter control, and stored in the plurality of sense amplifiers 1061. In the case where the data programmed is sixteen bits data (second multi-bits data) sixteen bits data n which corresponds to a read address, is read from the page buffer circuit 105 and stored in the plurality of sense amplifiers 1061.

Next, the data transfer control circuit 111 reads the storage data which is stored in the sense amplifiers 1061 of the sense amplifier section 106 synchronized with the internal control signal RE2x, and transferred to the plurality of registers 1121 of the data output section 112. In the case where the data programmed is eight bits data (first multi-bits data), via the data transfer control circuit 111, eight bits data n (n is an even number) which corresponds to a read address and eight bits data n+1 which corresponds to an address one above this read address, are read simultaneously from the sense amplifiers 1061 and transferred to the plurality of registers 1121. In the case when the programmed data is sixteen bits data (second multi-bits data), sixteen bits data n which corresponds to a read address is read from the sense amplifiers 1061 and stored in the plurality of registers 1121.

Next, the plurality of registers 1121 receives and stores data from the data transfer control circuit 111. The data output circuit 1122 outputs the data stored in the plurality of registers 1121 synchronized with the external control signal RE1x as output data IOx and transfers the data to the output pad section 113.

In this operation, in the case where eight bits data is programmed (first multi-bits data), when the external control signal RE1x and the internal control signal RE2x have a waveform as shown in FIG. 4, the data output circuit 1122 outputs the output data 10x synchronized with the external control signal RE1x as shown in FIG. 4, for each one byte (eight bits). That is, the data output circuit 1122, in a transfer cycle of the external control signal, reads eight bits data n (n is an even number) which corresponds to a read address from the plurality of registers 1121 and transfers the data to output pad section 113, and in the next transfer cycle of the external control signal, reads eight bits data n+1 which corresponds to an address one above this read address from the plurality of registers 1121 and transfers the data to the output pad section 113. In the case when sixteen bits data (second multi-bits data) is programmed, the output data 10x is output, synchronized with the external control signal RE1x, for each two bytes (sixteen bits).

As explained above, the NAND type flash memory related to embodiment one of the present invention, transfers data up to just before the data output circuit 1122 from the page buffer circuit 105, using a signal (internal control signal) with twice the cycles of the external control signal. Therefore, in the case when the data programmed is eight bits data (first multi-bits data) it is possible to enlarge a timing margin up to just before the data output circuit 1122 from the page buffer circuit 105, by a maximum of up to twice. Further, because the data transfer pass is arranged with a number of the number of sixteen bits, there is no need to again increase the number of data transfer passes. Also, the output of data up to the output pad section 113 from the plurality of registers 1121 which are added to the data output circuit 1122 is transferred using a signal which is synchronized with the external control signal and has the same cycle of the external control signal. Consequently, it is possible to easily increase speed regardless of the programmed data. Therefore, in the NAND type flash memory 100 related to embodiment one of the present invention, in the case where eight bits data (first multi-bits data) is read, it is possible to increase data transfer speed. And, because this operation is an operation within a chip, it is possible to increase speed without changing existing user usage.

Further, as another example related to embodiment one of the present invention, in the NAND type flash memory device 100, the first multi-bits data may have sixteen bits and the second multi-bits data may have thirty-two bits.

Embodiment Two

Figure 5:
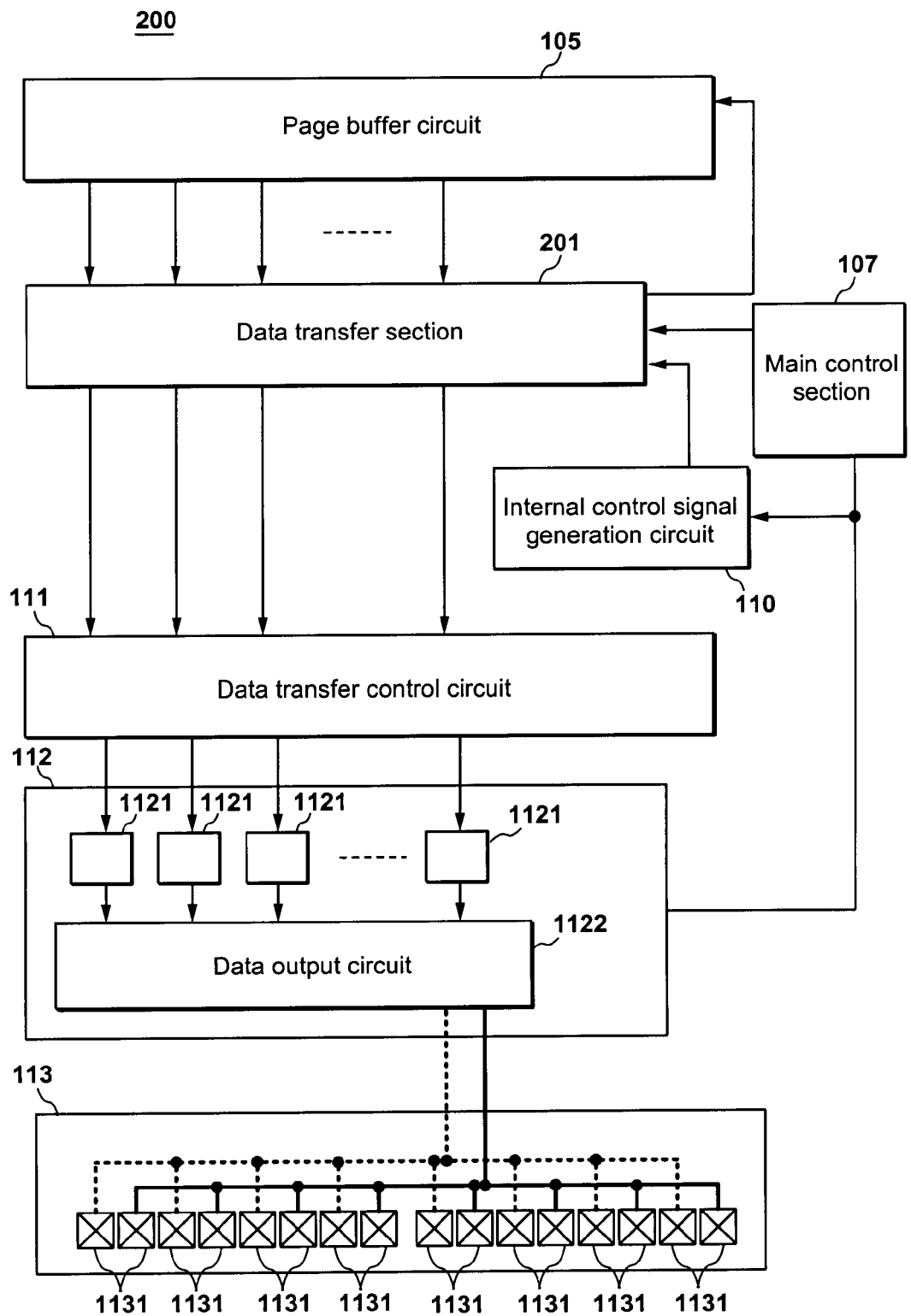
FIG. 5 is a block diagram which shows the construction of the required parts of one NAND type flash memory device of the nonvolatile semiconductor memory device related to embodiment two of this invention.

Next, embodiment two of the present invention will be explained in detail while referring to the drawings. FIG. 5 is a block diagram which shows the construction of the required parts for the NAND type flash memory device related to embodiment two of the present invention. In embodiment two of the present invention, the same construction elements as in embodiment one have the same symbols and thus their explanation is omitted.

As is shown in FIG. 5, the NAND type flash memory device 200 related to embodiment two of this invention includes a data transfer section 201 instead of the sense amplifier section 106 and the data transfer control circuit 111 in embodiment one of the present invention. That is, the NAND type flash memory device 200 related to embodiment two of the present invention includes the data transfer section 201 between the page buffer circuit 105 and the data output section 112 in embodiment one of the present invention.

The data transfer section 201 is connected to the page buffer circuit 105, the data output section 112, the main control section 107 and the internal control signal generation circuit 110. The data transfer section 201 receives an internal control signal (RE2x) which has twice the cycles of an external control signal (RE1x) from the internal control signal generation circuit 110.

The data transfer section 201 reads the first multi-bits data or the second multi-bits data synchronized with the internal control signal (RE2x) for each of the second number of bits, from the page buffer circuit 105 and transfers the data as data to the plurality of registers 1121 of the data output section 112. In the case where the data which is programmed is the first multi-bits data, the data transfer section 201 reads simultaneously the first multi-bits data n (n is an even number) which corresponds to a read address and the first multi-bits data n+1 which corresponds to an address which is one above this read address, from the page buffer circuit 105 and the data is transferred to the plurality of registers 1121. The control of this data transfer is the same as in embodiment one of the present invention stated above. Also, although the explanation is omitted, the transfer of data up to the output pad section 113 from the plurality of registers 1121, is transferred for each of the first number of bits, however, this is the same as embodiment one of the present invention stated above. Therefore, the effects of embodiment two of the present invention are also the same as the effects in embodiment one of the present invention.

In embodiments one and two of the present invention, because the first multi-bits data or the second multi-bits data is read and transferred for each of the second number of bits from the page buffer circuit 105 synchronized with the internal control signal (RE2x) which has twice the cycles of the external control signal (RE1x), when the first multi-bits data or the second multi-bits data is transferred, because data of the second number of bits is transferred in a transfer cycle, it is possible to increase the speed of data transfer.

What is claimed is:

1. A nonvolatile semiconductor device comprising:
   a plurality of word lines;
   a plurality of bit lines;
   a plurality of memory cell arrays having a plurality of electrically reprogrammable memory cells which are connected to said word lines and said bit lines;
   a data program control section which programs a plurality of first multi-bits data each having a first number of bits, or a plurality of second multi-bits data each having a second number of bits twice that of said first multi-bits data, to said plurality of memory cell arrays;
   a page buffer circuit which stores said plurality of first multi-bits data or said plurality of second multi-bits data which is read for each of said word lines from said plurality of memory cell arrays;
   a data transfer section which transfers said plurality of first multi-bits data or said plurality of second multi-bits data which is read for each of said second number of bits from said page buffer circuit synchronized with a second clock signal having a cycle which is twice that of a first clock signal; and
   a data output section which receives said data from said data transfer section and outputs externally said data in synchronization with said first clock signal.

2. The nonvolatile semiconductor memory device according to claim 1, wherein said data transfer section simultaneously reads data n (n is an even number) which corresponds to a read address and data n+1 which corresponds to an address one above said read address synchronized with said second clock signal in the case where said first multi-bits data is programmed to said plurality of memory cell arrays.

3. The nonvolatile semiconductor memory device according to claim 1, wherein said data output section includes a plurality of registers and a data output circuit, said plurality of registers being the same number as said second number of bits.

4. The nonvolatile semiconductor memory device according to claim 3, wherein said data output circuit outputs externally said data n in one transfer cycle of said first clock signal and outputs externally said data n+1 in a next transfer cycle of said first clock signal in the case where said first multi-bits data is programmed in said plurality of memory cell arrays.

5. The nonvolatile semiconductor memory device according to claim 1, further comprising an internal control signal generation circuit which generates a second clock signal synchronized with said first clock signal, said second clock signal having a cycle twice that of said first clock signal.

6. The nonvolatile semiconductor memory device according to claim 1, wherein said first multi-bits data has eight number of bits and said second multi-bits data has sixteen number of bits.

7. The nonvolatile semiconductor memory device according to claim 1, wherein said first multi-bits data has sixteen number of bits and said second multi-bits data has thirty-two number of bits.

8. A nonvolatile semiconductor device comprising:
   a plurality of word lines;
   a plurality of bit lines;
   a plurality of memory cell arrays having a plurality of electrically reprogrammable memory cells which are connected to said word lines and said bit lines;
   a data program control section which programs a plurality of first multi-bits data each having a first number of bits, or a plurality of second multi-bits data each having a second number of bits twice that of said first multi-bits data, to said plurality of memory cell arrays;
   a page buffer circuit which stores said plurality of first multi-bits data or said plurality of second multi-bits data which is read for each of said word lines from said plurality of memory cell arrays;
   a sense amplifier section which stores said plurality of first multi-bits data or said plurality of second multi-bits data which is read for each of said second number of bits from said page buffer circuit synchronized with a second clock signal having a cycle which is twice that of a first clock signal;
   a data transfer control circuit which transfers said data which is stored in said sense amplifier section which is read for each of said second number of bits synchronized with a second clock signal; and
   a data output section which receives said data from said data transfer control circuit and outputs externally said data in synchronization with said first clock signal.

9. The nonvolatile semiconductor memory device according to claim 8, wherein said sense amplifier section includes the same number of sense amplifiers as the number of said second bits, and includes a data selection section which selects said plurality of first multi-bits data or said plurality of second multi-bits data which is read in sequence for each of said second number of bits synchronized with second clock signal, said data being stored in said plurality of sense amplifiers.

10. The nonvolatile semiconductor memory device according to claim 9, wherein said data selection section simultaneously reads data n (n is an even number) which corresponds to a read address and data n+1 which corresponds to an address one above said read address synchronized with said second clock signal from said page buffer circuit, in the case where said first multi-bits data is programmed in said memory cell array.

11. The nonvolatile semiconductor memory device according to claim 8, wherein said data output section includes a plurality of registers and a data output circuit, said plurality of registers being the same number as said second number of bits.

12. The nonvolatile semiconductor memory device according to claim 11, wherein said data output circuit outputs externally said data n in one transfer cycle of said first clock signal and outputs externally said data n+1 in a next transfer cycle of said first clock signal in the case where said first multi-bits data is programmed in said plurality of memory cell arrays.

13. The nonvolatile semiconductor memory device according to claim 8, further comprising an internal control signal generation circuit which generates a second clock signal synchronized with said first clock signal, said second clock signal having a cycle twice that of said first clock signal.

14. The nonvolatile semiconductor memory device according to claim 8, wherein said first multi-bits data has eight number of bits and said second multi-bits data has sixteen number of bits.

15. The nonvolatile semiconductor memory device according to claim 9, wherein said first multi-bits data has eight number of bits and said second multi-bits data has sixteen number of bits.

16. The nonvolatile semiconductor memory device according to claim 8, wherein said first multi-bits data has sixteen number of bits and said second multi-bits data has thirty-two number of bits.

17. The nonvolatile semiconductor memory device according to claim 9, wherein said first multi-bits data has sixteen number of bits and said second multi-bits data has thirty-two number of bits 18. A method of data transfer in a nonvolatile semiconductor memory device comprising:

reading a plurality of first multi-bits data each having a first number of bits or reading a plurality of second multi-bits data each having a second number of bits twice that of said first multi-bits data, for each of said second number of bits from a page buffer circuit synchronized with a first clock signal which is synchronized with a second clock signal having a cycle twice that of said first clock signal, said data being read for each word line from a plurality of memory cell arrays and stored in said page buffer circuit;

transferring said data which is read from said page buffer circuit to a plurality of registers arranged in said second number of bits and storing said data in said plurality of registers; and transferring said data which is stored in said plurality of registers externally from said plurality of registers synchronized with said first clock signal for each volume of data of said first number of bits.

19. The method of data transfer in a nonvolatile semiconductor memory device according to claim 18, wherein data n (n is an even number) which corresponds to a read address and data n+1 which corresponds to an address one above said read address, is read simultaneously from said page buffer circuit and transferred to said plurality of registers synchronized with said second clock signal in the case where said first multi-bits data is programmed in said plurality of memory cell arrays.

20. The method of data transfer in a nonvolatile semiconductor memory device according to claim 19, wherein said data n is transferred externally from said plurality of registers in one transfer cycle of said first clock signal, and said data n+1 is transferred externally from said plurality of registers in a next transfer cycle of said first clock signal.

* * * * *